United States Patent [19]
Cox et al.

[11] Patent Number: 6,055,262
[45] Date of Patent: Apr. 25, 2000

[54] RESONANT REFLECTOR FOR IMPROVED OPTOELECTRONIC DEVICE PERFORMANCE AND ENHANCED APPLICABILITY

[75] Inventors: James Allen Cox, New Brighton; Robert A. Morgan, Plymouth, both of Minn.

[73] Assignee: Honeywell Inc., Morristown, N.J.

[21] Appl. No.: 08/872,534

[22] Filed: Jun. 11, 1997

[51] Int. Cl.[7] ............................... H01S 3/19; H01S 3/08
[52] U.S. Cl. ............................... 372/96; 372/45; 372/50
[58] Field of Search ................................ 372/96, 45, 50, 372/20; 359/566; 257/21; 385/37

[56] References Cited

U.S. PATENT DOCUMENTS

| | | | |
|---|---|---|---|
| 4,466,694 | 8/1984 | MacDonald | 385/37 |
| 5,115,442 | 5/1992 | Lee et al. | 372/45 |
| 5,216,680 | 6/1993 | Magnusson et al. | 372/20 |
| 5,475,701 | 12/1995 | Hibbs-Brenner | 372/50 |
| 5,555,255 | 9/1996 | Kock et al. | 372/96 |
| 5,561,683 | 10/1996 | Kwon | 372/96 |
| 5,568,499 | 10/1996 | Lear | 372/45 |
| 5,598,300 | 1/1997 | Magnusson et al. | 359/566 |
| 5,727,013 | 3/1998 | Botez et al. | 372/96 |
| 5,818,066 | 10/1998 | Duboz | 257/21 |

FOREIGN PATENT DOCUMENTS

| | | |
|---|---|---|
| 0288184A | 10/1988 | European Pat. Off. . |
| 0776076A | 5/1997 | European Pat. Off. . |
| 4240706A | 6/1994 | Germany . |

OTHER PUBLICATIONS

Graf, Rudolph, Modern Dictionary of Electronics, 6th ed., Indiana: Howard W. Sams & Company, Jan. 1984, p. 694.
Patent Abstracts of Japan, vol. 009, No. 280 (E–356), Nov. 8, 1985 and JP 60 123084A (Matsushita Denki Sangyo KK), Jul. 1, 1985.
Patent Abstracts of japan, vol. 014, No. 222 (E–0926), May 10, 1990 and JP 02 054981 A (Fujitsu Ltd.), Feb. 23, 1990.
Schubert E F et al: "Resonant Cavity Light–Emitting Diode" Applied Physics Letters, vol. 60, No. 8, Feb. 24, 1992, pp. 921–923, XP000292182.
Smith R E et al: "Polarization–Sensitive Subwavelength Antireflection Surfaces on a Semiconductor for 975 NM", Optics Letters, vol. 21, No. 15, Aug. 1, 1996, pp. 1201–1203, XP000622118.
Suning Tang et al: "Design Limitations of Highly Parallel Free–Space Optical Interconnects Based on Arrays of Vertical Cavity Surface–Emitting Laser Diodes, Microlenses, and Photodectectors", Journal of Lightwave Technology, vol. 12, No. 11, Nov. 1, 1994, pp. 1971–1975, XP000485315.

(List continued on next page.)

*Primary Examiner*—Teresa M. Arroyo
*Assistant Examiner*—Quyen P. Leung
*Attorney, Agent, or Firm*—Brian N. Tufte

[57] ABSTRACT

Optoelectronic devices such as VCSEL and RCPD devices that have integrated resonant reflectors. The integrated resonant reflector may be made conductive so that bias current can pass therethrough. This may allow more flexibility in the design of the VCSEL and RCPD devices.

Since making the resonant reflector more conductive typically reduces the overall reflectivity of the resonant reflector, the resonant reflector may be provided in combination with a Distributed Bragg Reflector (DBR) mirror to achieve the desired overall reflectance for a VCSEL or RCPD design. A broad bandwidth resonant reflector may also be provided. The bandwidth may be sufficiently wide to increase the reliability of data communication between such devices, and may be sufficiently narrow to maintain adequate mode control and mode stability. These devices may be used to support polarization-, space- and/or wavelength-division multiplexing applications.

37 Claims, 13 Drawing Sheets

OTHER PUBLICATIONS

Cox JA et al: "Guided Mode Grating Resonant Filters for VCSEL Applications" Proceedings of the SPIE, The International Society for Optical Engineering, Diffractive and Holographic Device Technologies and Applications V San Jose CA USA Jan. 28–29, 1998, vol. 3291, pp. 70–71, XP002077648.

S. S. Wang and R. Magnusson, "Theory and applications of guided–mode resonance filters", *Appl. Opt.,* vol. 32, No. 14, pp. 2606–2613 (May 1993).

S. S. Wang and R. Magnusson, "Multilayer waveguide–grating filters", *Appl. Opt.,* vol. 34, No. 14, pp. 2414–2420 (May 1995).

Y. M. Yang, M. H. Macdougal, and P. D. Dapkus, "Ultralow threshold current vertical cavity surface emitting lasers obtained with selective oxidation", *Elect. Lett.,* vol. 31, No. 11, pp. 886–888 (May 25, 1995).

K. L. Lear, K. D. Choquette, R. P. Schneider, Jr., S. P. Kilcoyne, and K. M. Geib, "Selectively oxidized vertical cavity surface–emitting lasers with 50% power conversion efficiency", *Elec. Lett.,* vol. 31, No. 3, pp. 208–209 (Feb. 2, 1995).

G. Shtengel, H. Temkin, P. Brusenbach, T. Uchida, M. Kim, C. Parsons, W. E. Quin and S. Swirhun, "High-Speed Vertical–Cavity Surface–Emitting Lasers", *Photon. Tech. Lett.,* vol. 5, No. 12, pp. 1359–1361 (Dec., 1993).

R. A. Morgan, J. A. Lehman and M. K. Hibbs–Brenner, "Vertical Cavity Surface Emitting Laser Arrays: Come of Age," Invited paper, published in SPIE vol. 2683–04, OE LASE 96; Photonics West: Fabrication, Testing, and Reliability of Semiconductor Lasers, (SPIE, Bellingham, WA, 1996).

J. A. Lehman, R. A. Morgan, M. K. Hibbs–Brenner, and D. Carlson, "High–frequency modulation characteristics of hybrid dielectric/AlGaAs Single–mode VCSELs", *Electron. Lett.,* vol. 31, No. 15, pp. 1251–1252 (Jul. 20, 1995).

R. A. Morgan, M. K. Hibbs–Brenner, T. M. Marta, R. A. Walterson, S. Bounnak, E. L. Kalweit, and J. A. Lehman, "200C, 96–nm Wavelength Range, Continuous–Wave Lasing From Unbonded GaAs MOVPE–Grown Vertical Cavity Surface Emitting Lasers", *IEEE Phot. Tech. Lett.,* vol. 7, No. 5, pp. 441–443 (May, 1995).

L. A. Hornak, J. C. Barr, W. C. Cox, K. S. Brown, R. A. Morgan, and M. K. Hibbs–Brenner, "Low–Temperature (10K—300K) Characterization of MOVPE–Grown Vertical–Cavity Surface–Emitting Lasers", *Photon. Tech. Lett.,* vol. 7., No. 10, pp. 1110–1112 (Oct., 1995).

R. A. Morgan, K. Kojima, M. T. Asom, G. D. Guth, and M. W. Focht, "One Watt Vertical Cavity Surface Emitting Laser", *Electron. Lett.,* vol. 29, No. 2, pp. 206–207 (Jan. 21, 1993).

D. B. Young, J. W. Scott, F. H. Peters, M. G. Peters, M. L. Majewski, B. J. Thibeault, S. W. Corzine and L. A. Coldren, "Enhanced Performance of Offset–Gain High–Barrier Vertical–Cavity Surface–Emitting Lasers", *IEEE J. Quantum Electron.,* vol. 29, No. 6, pp. 2013–2022, (Jun., 1993).

R. A. Morgan, M. K. Hibbs–Brenner, R. A. Walterson, J. A. Lehman, E. L. Kalweit, S. Bounnak, T. Akinwande and J. C. Nohava, "Producible GaAs–based MOVPE–grown vertical––cavity top–surface emitting lasers with record performance", *Elec. Lett.,* vol. 31, No. 6, pp. 462–464 (Mar. 16, 1995).

M. K. Hibbs–Brenner, R. A. Morgan, R. A. Walterson, J. A. Lehman, E. L. Kalweit, S. Bounnak, T. M. Marta and R. Gieske, "Performance, Uniformity and Yield of 850nm VCSELs Deposited by MOVPE", *IEEE Phot. Tech. Lett.,* vol. 8, No. 1, pp. 7–9 (Jan., 1996).

J. K. Guenter, R. A. Hawthorne, III, D. N. Granville, M. K. Hibbs–Brenner and R. A. Morgan, "Reliability of proton–implanted VCSELs for data communications", Invited paper, published in SPIE vol. 2683, OE LASE 96; Photonics West: Fabrication, Testing, and Reliability of Semiconductor Lasers, (SPIE, Bellingham, WA, 1996). (no month available).

Y. H. Lee, B. Tell, K. Brown–Goebler and J. L. Jewell, "Top–Surface–Emitting GaAs Four–Quantum–Well Lasers Emitting at 0.85mm", *Electron. Lett.,* vol. 26, No. 11, pp. 710–711, (May 24, 1990).

D. L. Huffaker, J. Shin and D. G. Deppe, "Lasing characteristics of low threshold microcavity layers using half–wave spacer layers and lateral index cofinement", *Appl. Phys. Lett.,* vol. 66, No. 14, pp. 1723–1725 (Apr. 3, 1995).

E. Yablonovitch, "Photonic Bandgap structures", *J. Opt. Soc. Am. B,* vol. 10, No. 2, pp. 283–295, (Feb., 1993).

R. A. Morgan, M. K. Hibbs–Brenner, J. A. Lehman, E. Kalweit, R. Walterson, T. Marta and T. Akinwande, "Hybrid Dielectric/AlGaAs Mirror Spatially–Filtered Vertical Top––Surface Emitting Laser", *Appl. Phys. Lett.,* vol. 66, No. 10, pp. 1157–1159 (Mar. 6, 1995).

E. F. Schubert, Y. H. Wang, A. Y. Cho, L. W. Tu and G. J. Zydzik, "Resonant cavity light–emitting diode", *Appl. Phys. Lett.,* vol. 60, No. 8, pp. 921–923 (Feb. 24, 1992).

J. L. Jewell et al., "Surface Emitting Microlasers for Photonic Switching & Intership Connections", *Optical Engineering,* vol. 29, No. 3, pp. 210–214, Mar. 1990.

Morgan, Transverse Mode Control of Vertical–Cavity Top–Surface–Emitting Lasers, *IEEE Phot. Tech. Lett.,* vol. 4, No. 4, p. 374, Apr. 1993.

Magnusson, "Integration of Guided–Mode Resonance Filters and VCSELs", Electro–Optics Research Center, Department of Electrical Engineering, University of Texas at Arlington, May 6, 1997.

RESONANT REFLECTOR FOR IMPROVED OPTOELECTRONIC DEVICE PERFORMANCE AND ENHANCED APPLICABILITY

BACKGROUND OF THE INVENTION

This invention relates to the field of optoelectronic devices, and more particularly relates to optoelectronic devices that use reflectors such as vertical cavity surface emitting lasers and resonant cavity photodetectors.

Conventional semiconductor lasers have found widespread use in modern technology as the light source of choice for various devices, e.g., communication systems, compact disc players, and so on. For many of these applications, a semiconductor laser is coupled to a semiconductor receiver (e.g. photodiode) through a fiber optic link or even free space. This configuration may provide a high speed communication path.

A typical edge-emitting semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Another type of semiconductor laser which has come to prominence in the last decade are surface emitting lasers. Several types of surface emitting lasers have been developed. One such laser of special promise is termed a "vertical cavity surface emitting laser" (VCSEL). (See, for example, "Surface-emitting microlasers for photonic switching and interchip connections", *Optical Engineering*, 29, pp. 210–214, March 1990, for a description of this laser. For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 µm", *Electronics Letters*, 26, pp. 710–711, May 24, 1990.)

Vertical Cavity Surface Emitting Lasers offer numerous performance and potential producibility advantages over conventional edge emitting lasers. These include many benefits associated with their geometry, such as amenability to one- and two-dimensional arrays, wafer-level qualification, and desirable beam characteristics, typically circularly-symmetric low-divergence beams.

VCSELs typically have an active region with bulk or one or more quantum well layers. On opposite sides of the active region are mirror stacks which are typically formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is typically turned on and off by varying the current through the active region.

High-yield, high performance VCSELs have been demonstrated, and exploited in commercialization. Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

VCSELs are expected to provide a performance and cost advantages in fast (e.g. Gbits/s) medium distance (e.g. up to approximately 1000 meters) single or multi-channel data link applications, and numerous optical and/or imaging applications. This results from their inherent geometry, which provides potential low-cost high performance transmitters with flexible and desirable characteristics.

Most VCSELs of practical dimensions are inherently multi (transverse) mode. Single lowest-order mode VCSELs are favored for coupling into single-mode fibers, and are advantageous for free-space and/or wavelength sensitive systems, and may even be beneficial for use in extending the bandwidth-length product of standard 50 µm and 62.5 µm GRIN multi-mode fiber. However, it has long been known that, although the short optical cavity ($\cong 2\lambda$) of the VCSEL favors single longitudinal mode emission, the multi-wavelength ($\cong 10\lambda$) lateral dimensions facilitate multi-transverse mode operation.

Higher order modes typically have a greater lateral concentration of energy away from the center of the lasing cavity. Thus, the most obvious way to force the laser to oscillate in only a lowest order circularly symmetric mode is to make the lateral dimension of the active area small enough to prevent higher-order modes from reaching threshold. However, this necessitates lateral dimensions of less than about 5 µm for typical VCSELs. Such small areas may result in excessive resistance, and push the limits obtainable from conventional fabrication methodologies. This is particularly true for implantation depths of greater than about 1 µm, where lateral straggle may become a limiting factor. Thus, control of transverse modes remains difficult for VCSEL's of practical dimensions.

One suggested approach to help control transverse modes in VCSELs is to use a smaller dimension "w" for an exit window relative to the excitation dimension "g" of the lasing cavity. This approach is suggested in Morgan et al., "Transverse Mode Control of Vertical-Cavity Top-Surface-Emitting Lasers", IEEE Phot. Tech. Lett., Vol. 4, No. 4, p 374 (April 1993). Morgan et al. suggest making the lateral dimension of the exit window "w" in a top metal contact smaller than the gain guide aperture "g" (which defines the lateral dimension of the excitation area of the lasing cavity). In this configuration, the top metal contact (typically gold) interfaces directly with the top layer of the top semiconductor mirror stack, and around the perimeter of the excitation area of the lasing cavity.

In the exit window, the top layer of the top semiconductor mirror stack interfaces directly with air or the like. Morgan et al. suggest that this configuration may help control lateral mode emission because the reflectivity of the gold-semiconductor interface may be phase-mismatched and/or non-specular, and thus, may provide less reflectivity than the semiconductor-air interface.

The lower reflectivity at the gold-semiconductor interface may reduce the possibility that higher order modes will generate in and around the perimeter of the lasing cavity. This may effectively reduce the lateral optical dimension of the excitation of the lasing cavity, and allow larger fabrication dimensions.

A limitation of this approach is that the discrimination between the reflectivity of the gold-semiconductor interface and the semiconductor-air interface may not be large enough to effectively control higher order modes, particularly at higher bias currents. Further, the reflectance at the gold-semiconductor interface and the semiconductor-air interface may not be sufficiently controllable or reproducible for commercial applications. In addition, the efficiency of these "spatially filtered" VCSELs is non-optimum.

In addition to mode control, another limitation of many prior art VCSEL devices is mode stability. The emission mode emitted by a conventional VCSEL device is often dependent on temperature effects such as thermal lensing and spatial hole burning, bias conditions, etc. Thus, conventional VCSEL devices may not provide a stable output emission mode under all expected operation conditions.

Dielectric resonant reflection filters are discussed in "Theory and Applications of Guided-mode Resonance Filters", S. S. Wang and R. Magnusson, Applied Optics, Vol. 32, No. 14, May 10, 1993. Wang et al. suggest using a dielectric anti-reflective film with a high spatial frequency dielectric grating. Using this approach, it is suggested that a 100% reflective narrow-band spectrally selective mirror may be provided.

The design of narrow band resonant reflection filters based on multilayer waveguide-grating structures is discussed in "Multilayer Waveguide-Grating Filters", S. S. Wang and R. Magnusson, Applied Optics, Vol. 34, No. 14, May 10, 1995). Examples are given for single-, double-, and triple-layer waveguide-grating filters. Here, Wang et al. suggest, among other things, using their narrow band dielectric reflection filters as a mirror for a VCSEL array.

Using a narrow band dielectric resonant reflection filter as a mirror for a VCSEL array has a number of limitations, some of which are described below. First, it is noted that the dielectric reflection filter of Wang et al. is not conductive, and thus cannot be used in the current injection path, for example from a contact of a VCSEL device through a corresponding active region. The mirrors of conventional VCSEL devices typically are semiconductor distributed Bragg reflectors (DBRs). Semiconductor DBR mirrors can be conductive, and often provide a current path from a contact of a VCSEL to the active region. If the dielectric resonant reflection filter of Wang et al. is used to replace, for example, the top mirror of a VCSEL device, the upper contact must be positioned between the dielectric reflection filter and the active region. This may severely limit the design of many VCSEL structures.

Second, the suggested "narrow band" dielectric resonant reflection filter of Wang et al. may not provide a large enough operating wavelength for many opto-electronic applications, including optical communication applications. In "Multilayer Waveguide-Grating Filters", S. S. Wang and R. Magnusson, Applied Optics, Vol. 34, No. 14, May 10, 1995), Wang et al. provide examples of single-, double-, and triple-layer waveguide-grating filters. In each case, the Full Width Half Maximum (FWHM) reflectance bandwidth appears to be less than about 1 nm. A resonance of less than 1 nm may not provide a large enough bandwidth for use in a resonant cavity photodetector (RCPD) or other optical receiver.

A resonant cavity photodetector is typically constructed similar to a VCSEL, but operates in a reverse bias mode. A resonant cavity photodetector may be more efficient than a standard photodiode because the light that enters the cavity, through one of the mirrors, may be effectively reflected through the active region many times. The light may thus be reflected between the mirror stacks until the light is either absorbed by the active region or until it escapes through one of the mirror stacks. Because the mirror stacks are typically highly reflective near resonance, most of the light that enters the cavity is absorbed by the active region.

The "narrow band" dielectric resonant reflection filter of Wang et al. attempts to achieve a very narrow bandwidth, presumably to increase the frequency selectivity of the filter. However, for many VCSEL applications such as in a VCSEL/RCPD electro-optical communication path, it may be beneficial for the wavelength bandwidth of the RCPD device to be increased, and should be broad enough to compensate for a number of factors including manufacturing tolerances of the VCSEL and RCPD devices, device alignment, noise, heat and other factors. This would also be beneficial in utilizing a resonant reflector to construct a multi-mode VCSEL. This may enable a broader bandwidth detector for use in a communication link exhibiting a finite wavelength variation or broad bandwidth source.

SUMMARY OF THE INVENTION

The present invention overcomes many of the disadvantages of the prior art by providing optoelectronic devices such as VCSEL and RCPD devices that have an integrated resonant reflector. The integrated resonant reflector may be made conductive so that bias current can pass therethrough. This may allow more flexibility in the design of VCSEL and RCPD devices. Since making the resonant reflector more conductive reduces the overall achievable reflectivity of the resonant reflector, the resonant reflector may be provided in combination with a Distributed Bragg Reflector (DBR) mirror to achieve the required overall reflectance for a VCSEL or RCPD design.

A broad bandwidth resonant reflector (FWHM>1 nm) may also be provided to produce a VCSEL or RCPD with a wider bandwidth. The bandwidth may be sufficiently wide to increase the reliability of data communication between such devices. In addition, for those VCSEL applications where a multi-mode emission is desired, a broader bandwidth resonant reflector may be provided.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
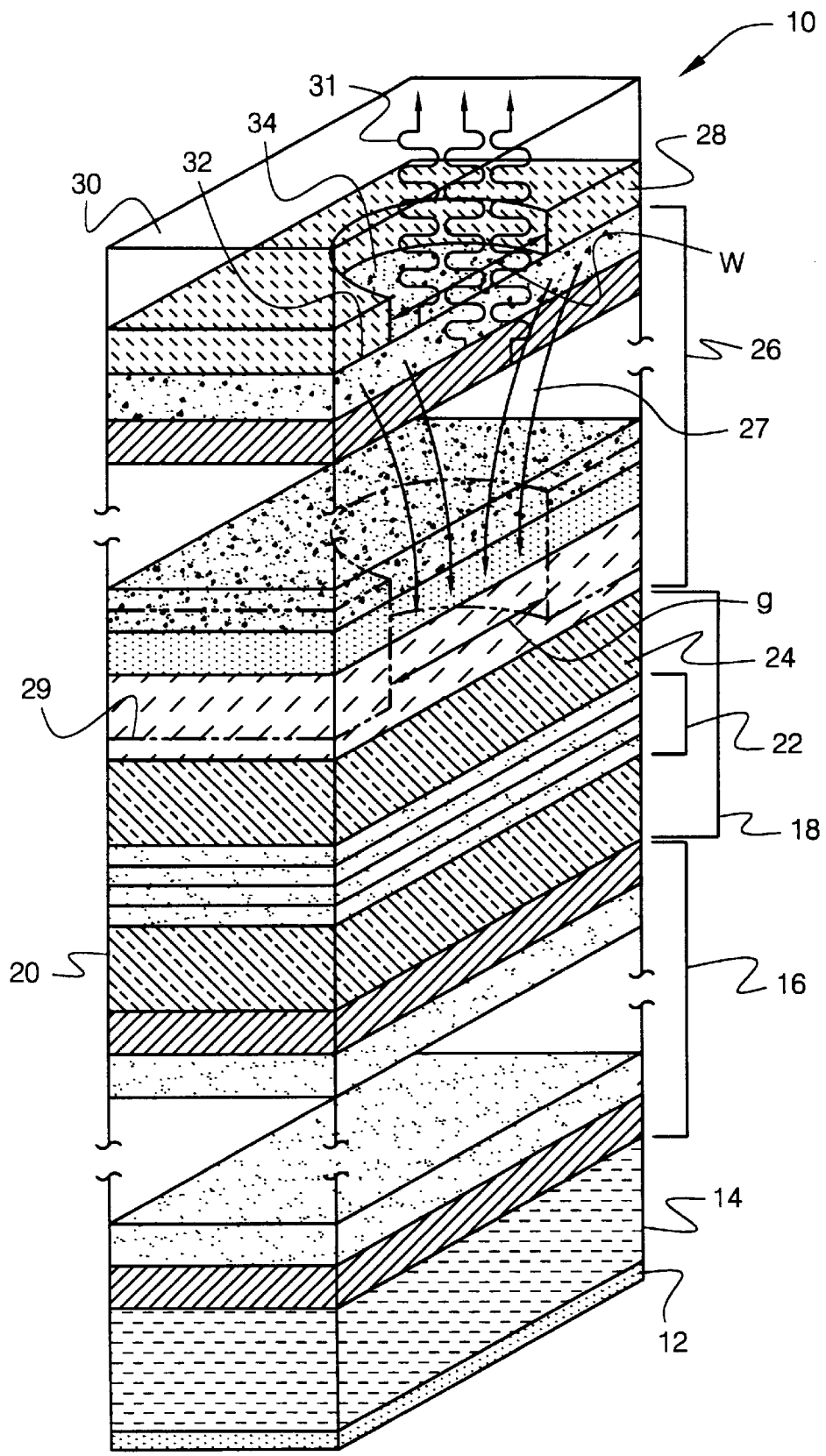
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is an n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

The diameter "w" of the exit aperture 34 may be smaller than the diameter "g" of the non-conductive region 29. This may reduce the contact resistance and improve the fabrication tolerance. Because most of the energy for higher order modes is concentrated away from the center of the lasing cavity, this may also help reduce the number of modes the laser produces at a given drive current. The diameter "w" may also be larger than "g" to obtain greater (typically multi-mode) output power.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g. $\lambda$=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

Figure 2:
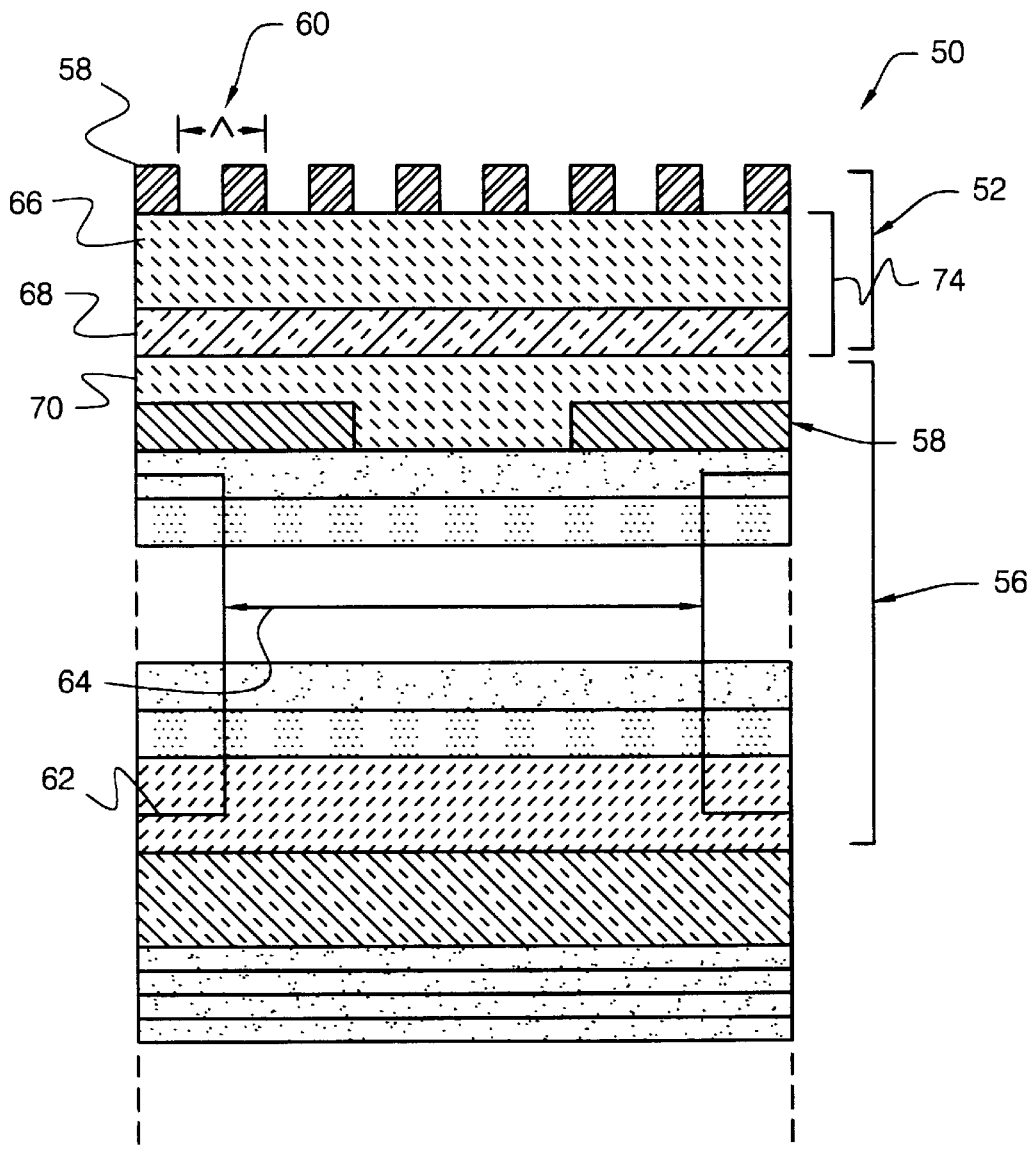
FIG. 2 is a schematic diagram of a planar, current-guided, GaAs/AlGaAs top surface emitting vertical cavity laser wherein the top mirror includes in combination a resonant reflector and a distributed Bragg reflector.

FIG. 2 is a schematic diagram of a planar, current-guided, GaAs/AlGaAs top surface emitting vertical cavity laser 50 with a hybrid top mirror including a resonant reflector 52 and a distributed Bragg reflector 56. One embodiment of the present invention combines the anomalous filtering properties of guided mode resonances in a dielectric waveguide grating with the reflective properties of a conventional DBR mirror.

The illustrative resonant reflector 52 includes a three layer waveguide-grating structure suitable for use in a near IR VCSEL. The three layer stack may be designed to function both as an anti-reflection (AR) coating near the emission wavelength for the VCSEL-structure substrate and independently as a guided-mode resonant reflector waveguide-grating. The three layers 52 may form an anti-reflective region which provides little reflectance for at least a predetermined range of wavelengths including a resonant wavelength. The grating multilayer waveguide structure, also shown at 52 causes the structure to become substantially more reflective at least at the resonant wavelength.

Alternatively, the three layer stack may be designed to function both as a high-reflectivity coating for the VCSEL-structure substrate and independently as a guided-mode resonant reflector waveguide-grating. In this embodiment, the three layers 52 form a highly-reflective mirror region which provides reflectance for at least a predetermined range of wavelengths including a resonant wavelength (e.g., near 980 nm). The overall reflectance of the top mirror, including layers 66 and 68, may be less than that required for lasing. This may be accomplished by, for example, reducing the number of mirror periods in the top DBR mirror 56. Grating layer 58 causes the guided mode resonant reflector structure 52 to become substantially more reflective at least near the resonant wavelength. In both of the above embodiments, the number of DBR mirror layers beneath the resonant reflector region may be reduced relative to a conventional VCSEL construction.

Resonance is achieved in the resonance reflector 52 by matching the evanescent first-diffraction order wavevector of the grating 58 to the propagating mode of the multi-layer waveguide 52. Since the latter depends on polarization, the reflectance is inherently polarization-selective. The resonant wavelength is determined primarily by the grating period 60, and the bandwidth is determined primarily by the modulation of refractive index and fill factor of the grating 58.

A typical near IR VCSEL requires high reflectivity (>99%). Thus, an all-semiconductor DBR typically requires 20–40 mirror periods with a thickness of 2–4 $\mu$m. As such, the epi-structure required for a complete VCSEL, including both top and bottom DBR mirrors surrounding an active spacer region typically includes over 200 layers having a thickness in excess of 7–8 μm.

To reduce the mirror thickness, and in at least one embodiment of the present invention, a hybrid mirror structure is contemplated. The hybrid mirror structure includes, for example, a resonant reflector 52 and a DBR mirror 56. Although not explicitly shown, it is contemplated that the bottom mirror may also include a resonant reflector structure. It is known that a dielectric resonant reflector 52 is highly reflective on resonance, and may be more reflective than a corresponding DBR type mirror at this same wavelength. Thus, by using this hybrid approach, it is contemplated that the number of DBR mirror periods needed for a given reflectance may be reduced.

It is known that lateral straggle effects during ion implantation of the gain guiding region 62 through the DBR mirrors often limits the lateral dimension 64 of the active region to $\geq 10$ μm. This directly impacts the minimum achievable threshold current, single mode operation, and indirectly impacts the speed of the VCSEL. By incorporating a resonant reflector into the top mirror, equivalent or superior reflectance properties in a structure five to ten times thinner may be achieved. This may translate into an ion implant that is more controllable, which may reduce the volume of the active region. A smaller active region may reduce the operating current and power of the device, improve planarity and thus the monolithic integrability of the VCSEL with electronics and smart pixels, and may provide a controllable single mode and single polarization emission with increased modal control.

It is recognized that the hybrid approach of the present invention is compatible with alternate existing gain-guiding techniques including etched pillars (with or without planarization and/or regrowth), lateral oxidation, selective growth, etc. By decreasing the overall thickness of the VCSEL mirrors, the resonant reflector may improve the processiblility and performance of the alternate current guiding approaches.

In the embodiment shown in FIG. 2, a broad band resonant reflector 52 having a wider bandwidth than that suggested by Wang et al. may replace one or both of the VCSEL (or RCPD) mirrors, or may be used in combination with one or more DBR mirrors as described above. As indicated above, the bandwidth of a resonant reflector is primarily determined by the modulation of the refractive index and fill factor of the grating. In accordance therewith, the present invention contemplates providing a broad band resonant reflector having a relatively wide bandwidth (FWHM >1 nm) in combination with a VCSEL and/or RCPD device.

Figure 7:
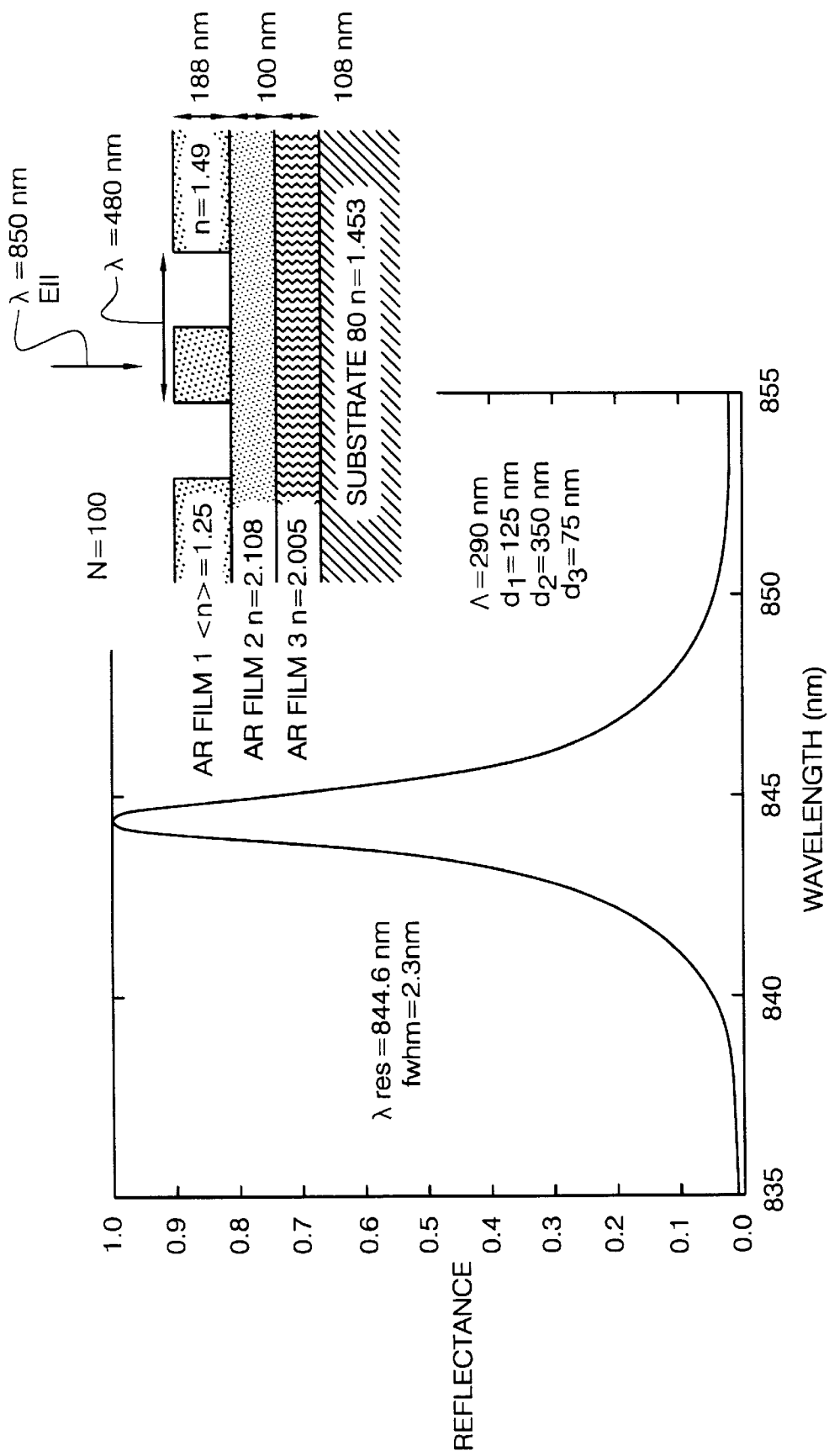
FIG. 7 is a graph illustrating the reflectivity characteristics of a broad band resonant reflector.

Preferably, the bandwidth of the resonant reflector is sufficiently wide to increase the reliability of data communication between VCSEL and RCPD devices. FIG. 7 is a graph showing simulation results of the reflectivity characteristics from a resonant reflector having a resonance wavelength of 844.6 nm, and a FWHM=2.3 nm. Even wider bandwidths are contemplated particularly for RCPD devices, and for VCSEL devices that are intended to have a multi-mode emission.

Figure 3:
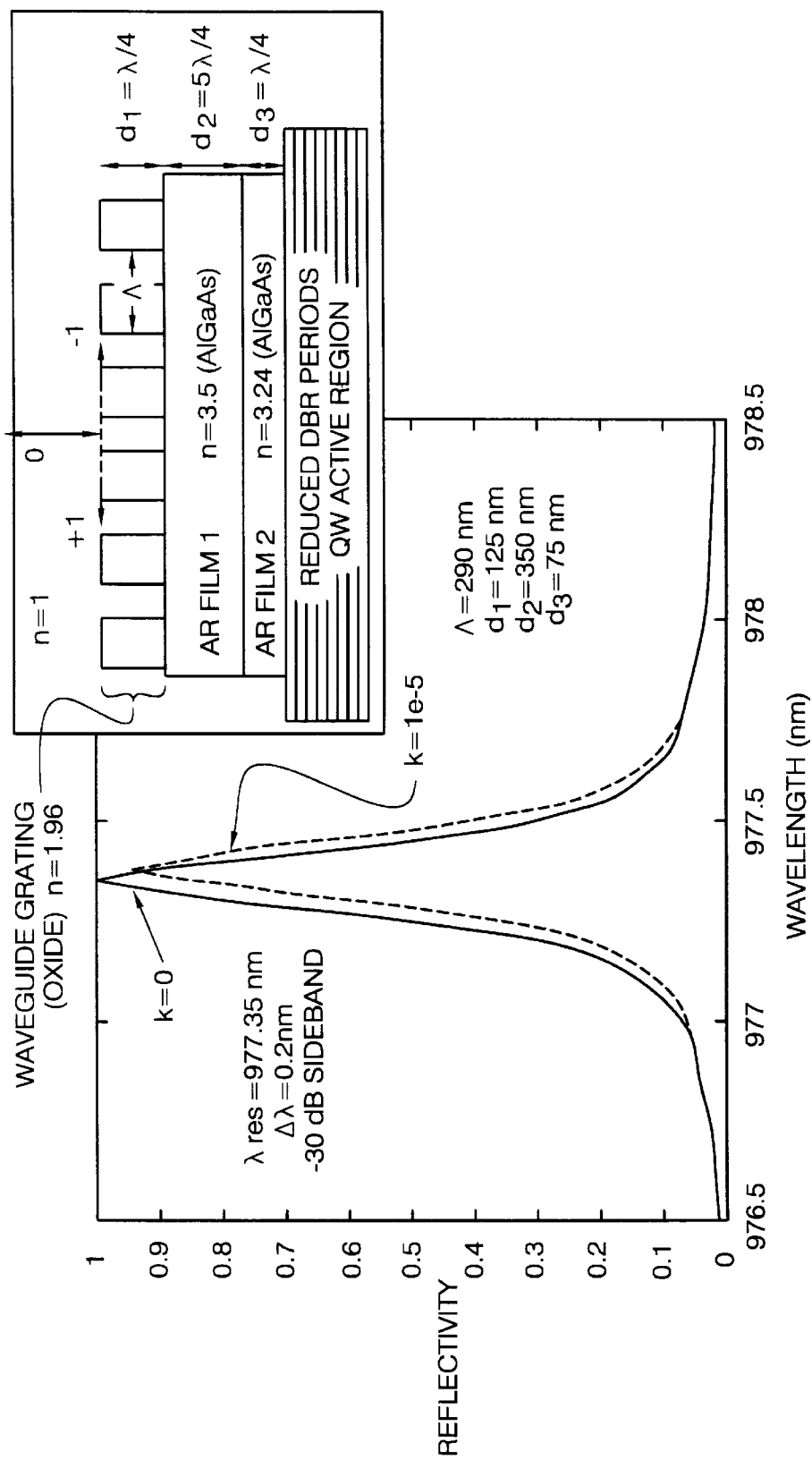
FIG. 3 is a graph illustrating the reduced reflectivity of a resonant reflector when constructed to be made conductive.

FIG. 3 is a graph showing reflectance curves for a resonant reflector assuming two values for the imaginary component of the refractive index (k=0 and $10^{-5}$) in any one layer of the waveguide-grating structure, and k=0 in the other two layers. The construction of the resonant reflector is a three layer structure, as shown. The top layer, middle layer and bottom layer are preferably formed from Indium-Tinoxide (ITO), GaAs, and AlGaAs, respectively. The refraction indices for the top, middle and bottom layers are 1.96, 3.5 and 3.24, respectively, and the thicknesses of the top, middle and bottom layers are preferably $\lambda/4$, $3\lambda/4$ and $\lambda/4$, respectively. These layers are on a substrate with an effective reflective index of 3.3. This structure is simulated to exhibit one transverse Electric (TE) mode resonance (with a polarization parallel to the grating), no perpendicular resonance and a low out of resonant reflectance near $10^{-6}$.

The imaginary component "k" of the refractive index is related to optical absorption and electrical conductivity of the resonant reflector. The case k=$10^{-5}$, which roughly corresponds to the minimum conductivity required to inject current through the resonant reflector and into the active region, produces about 5 percent absorption. The same three layers with k=0, indicating a dielectric resonant reflector, produces theoretically 100 percent reflectance.

It is recognized that suitable materials may not be readily available for providing a resonant reflector that simultaneously provides electrical-conductivity and high reflectivity. In view thereof, a hybrid mirror approach is contemplated, combining a resonant reflector and a DBR mirror stack.

Figure 4:
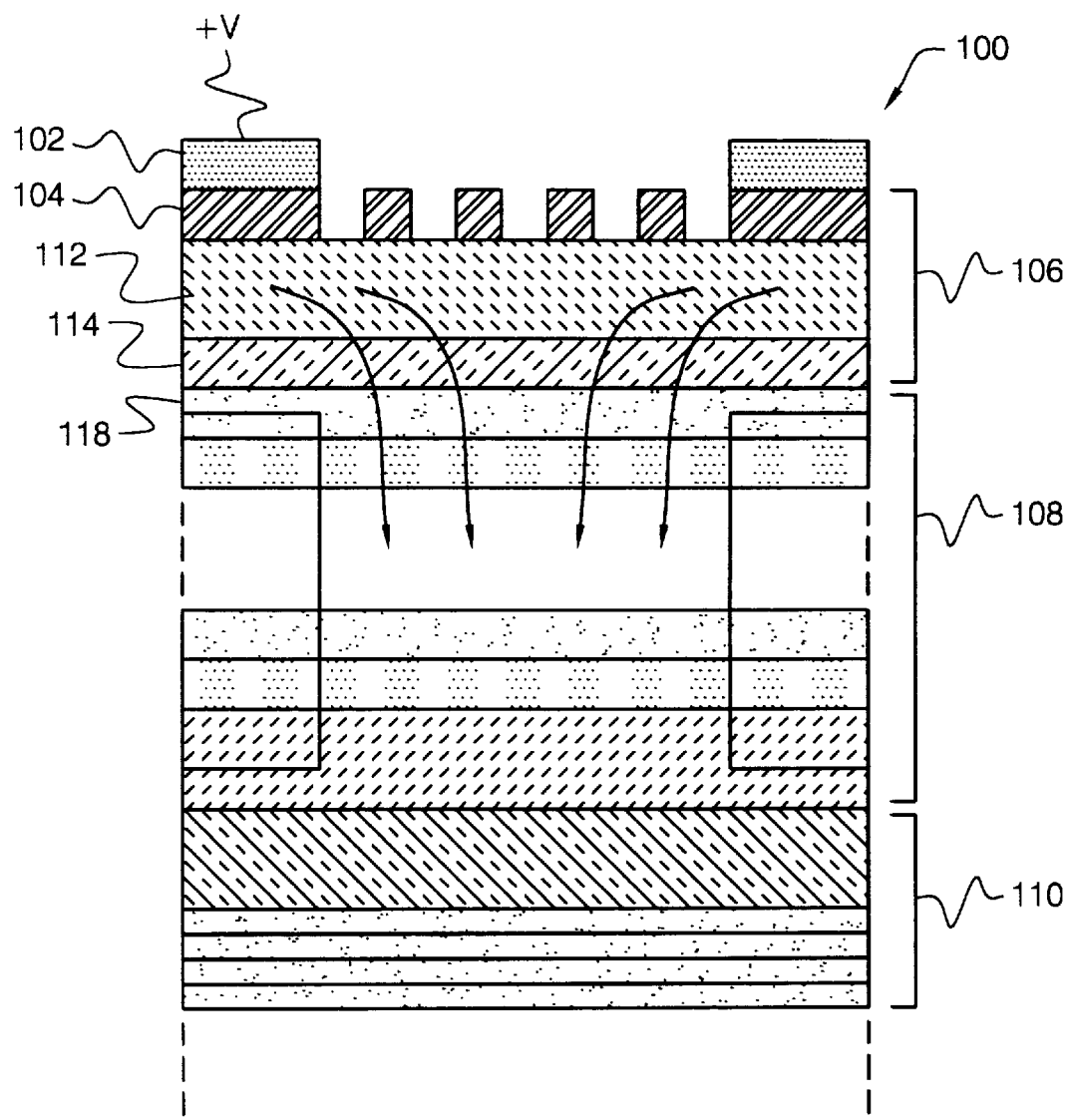
FIG. 4 is a schematic diagram of a vertical cavity laser similar to that shown in FIG. 2 with the top contact positioned on top of the waveguide grating of a conductive resonant reflector.

Preferably, a three layer resonant reflector is provided in combination with about five periods of a conventional DBR (see FIG. 4). A straight-forward analysis using simple Fabry-Perot reflectance equations shows that a 5 period DBR mirror in combination with a resonant reflector having about 5 percent absorption (k=$10^{-5}$) yields a total of about 99.5% reflectivity, which is more than adequate for a VCSEL mirror. This is intuitively clear since the reflectance of the DBR layers limits the transmitted intensity of light emission reaching the resonant reflector to about 10 percent. Even with about 5 DBR mirror periods, the DBR stack is over five times thinner than conventional VCSEL DBR mirrors.

By providing a conductive resonant reflector, current may be injected through the resonant reflector. This may allow the contacts of VCSEL or RCPD devices to be placed on or within the resonant reflector and further away from the active region. This may enable or simplify the fabrication of many VCSEL and RCPD devices.

FIG. 4 is a schematic diagram of a vertical cavity laser 100 similar to that shown in FIG. 2 with the top contact 102 positioned on top of the waveguide grating 104 of a conductive resonant reflector 106. In this embodiment, the resonant reflector 106 must be made conductive to allow bias current to flow from the contact 102 to the active region 110, via the DBR mirror 108. Preferably, the resonant reflector is made conductive by, for example, forming the resonant reflector from materials such as transparent metals including ITO, or doped semiconductor materials such as AlGaAs.

As indicated above, a resonant reflector structure typically must have two elements to function properly, including a grating and a waveguide. The grating typically must have a period that is close enough to the desired wavelength such that only the zero order propagates and the first orders, in particular, are evanescent. It is noted that if properly constructed, the grating may also serve as the waveguide.

The illustrative resonant reflector 106 is a three layer structure including a grating layer 104, and two film layers 112 and 114, respectively. Preferably, the top grating layer 104 is formed from ITO; the middle waveguide layer 112 is formed from GaAs; and the bottom layer 114 is formed from AlGaAs. Layers 112 and 114 may be doped with, for example, carbon to facilitate conductivity. The thickness of each of the resonant reflector layers preferably is an odd multiple of λ/4. For example, the thicknesses of the top, middle and bottom layers are preferably λ/4, 3λ/4 and λ/4, respectively.

While a three layer resonant reflector is shown, it is contemplated that any number of layers may be used to form the resonant reflector. In addition, the grating layer 104 need not be positioned on top of layers 112 and 114. Rather, the grating layer 104 may be positioned, for example, between layers 112 and 114, as shown in Wang et al.

For waveguiding, at least one of the three layers must have an index of refraction that is higher than the materials surrounding the resonant reflector 106. In the embodiment shown, the surrounding materials are air on top, and the layers including and beneath layer 118 of the DBR mirror on the bottom. Thus, and in the illustrative embodiment, at least one of the three layers 104, 112 and 114 must have an index of refraction that is greater than both air (n=1) and the effective index of refraction of the DBR mirror 108. The DBR mirror 108 may be formed from doped AlGaAs layers.

Figure 5A:
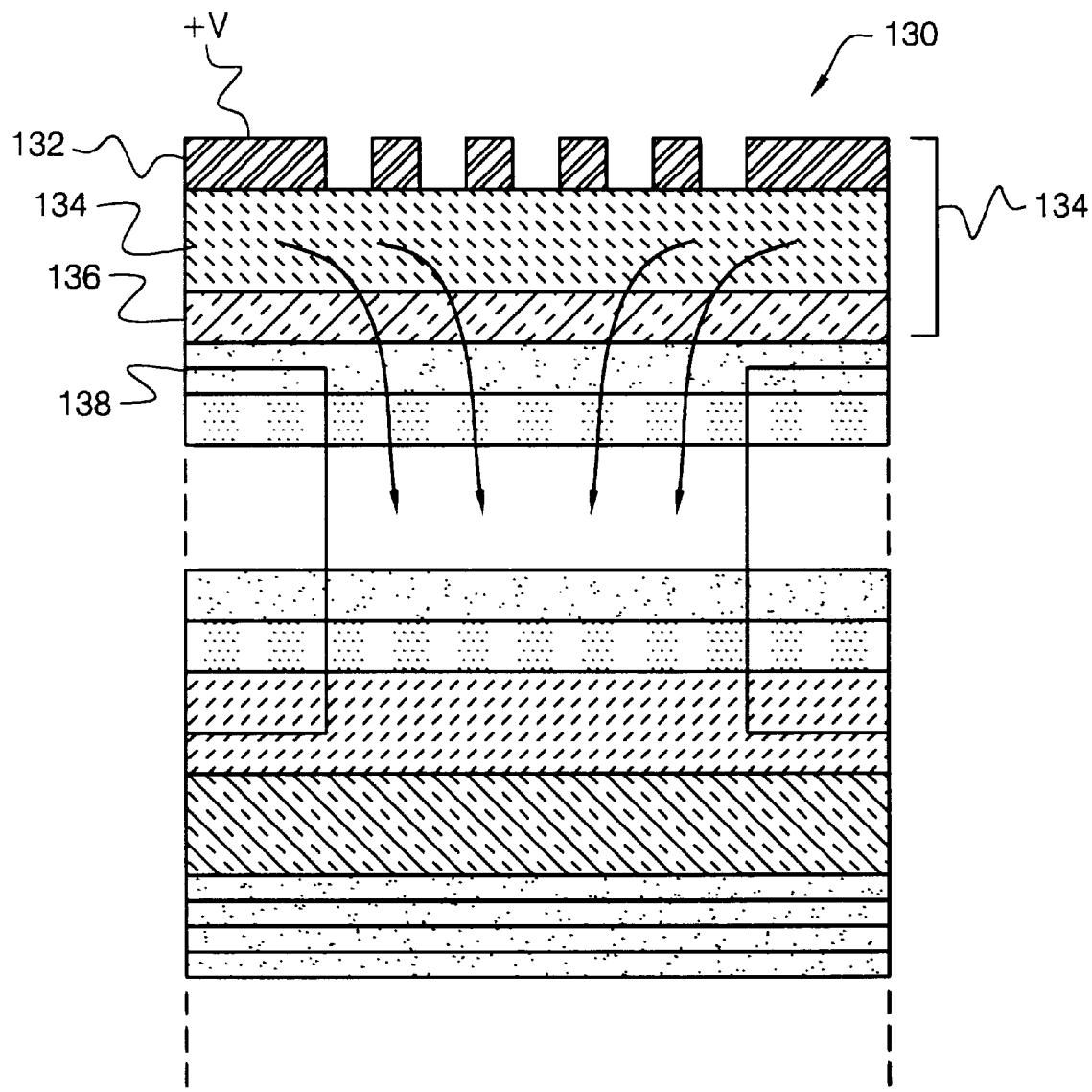
FIG. 5A is a schematic diagram of a vertical cavity laser similar to that shown in FIG. 3 with the waveguide grating of the resonant reflector functioning as the top contact.

FIG. 5A is a schematic diagram of a vertical cavity surface emitting laser 130 similar to that shown in FIG. 3 with the waveguide grating 132 of the resonant reflector 134 functioning as the top contact. Rather than providing a top contact layer 102 as shown in FIG. 4, this embodiment contemplates using the waveguide grating layer 132 as the top contact. The top waveguide grating layer 132 is preferably formed from a transparent metal such as ITO, and the grating is formed over or under the exit aperture of the VCSEL, as shown. Preferably, the middle layer 134 and the bottom layer 136 are formed from GaAs and AlAs, respectively. The top DBR mirror layer 138 is preferably formed from AlGaAs.

Figure 5B:
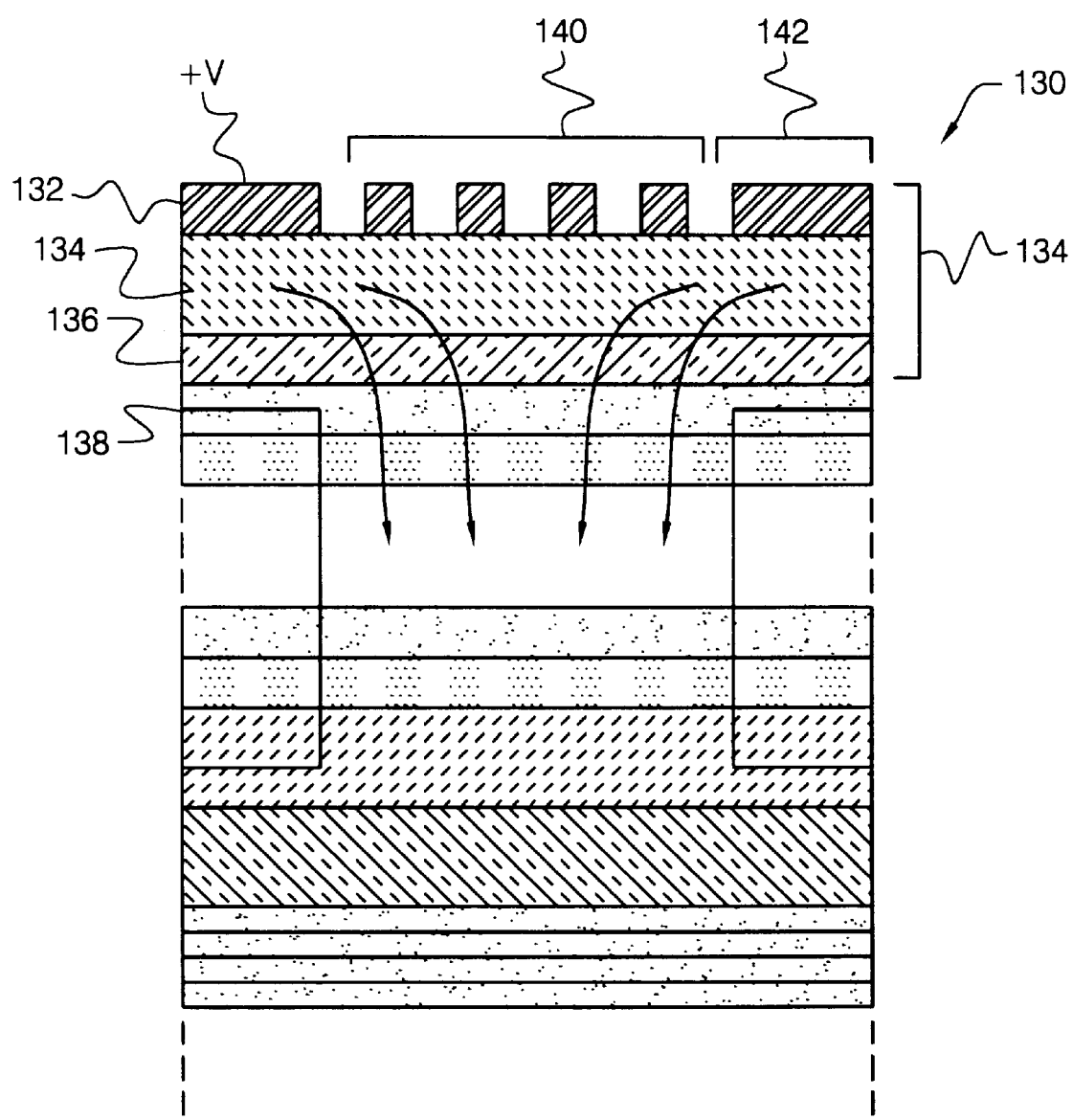
FIG. 5B is a schematic diagram of a vertical cavity laser similar to that shown in FIG. 5A, except that the waveguide grating of the resonant reflector is formed from a different material than the contact.

FIG. 5B is a schematic diagram of a vertical cavity laser similar to that shown in FIG. 5A, except that the waveguide grating of the resonant reflector is formed from a different material than the contact. In this embodiment, the grating 140 may be formed from, for example, SiO$_2$, and the contact portion 142 may be formed from Au. This may provide an alterative construction for a VCSEL or RCPD device.

Figure 6:
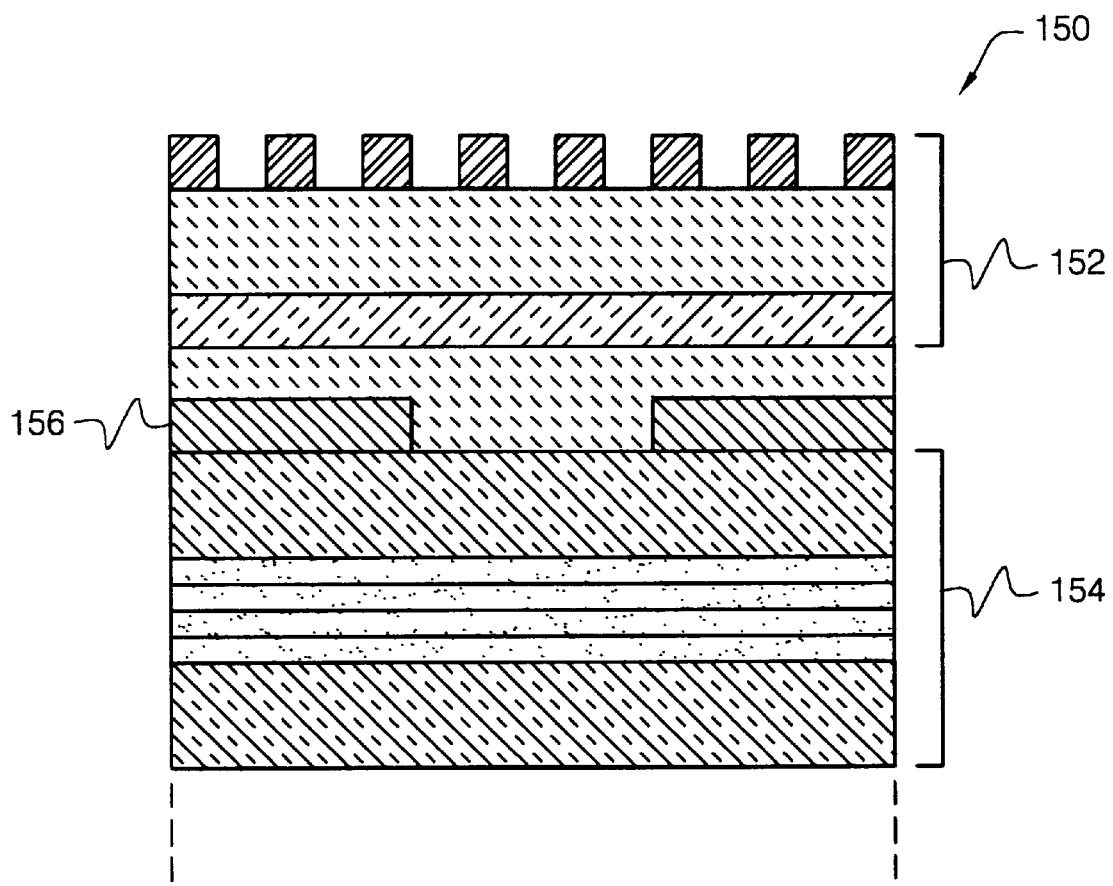
FIG. 6 is a schematic diagram of a vertical cavity laser with the top mirror replaced with a broad bandwidth resonant reflector.

FIG. 6 is a schematic diagram of a vertical cavity laser 150 with the conventional top mirror replaced with a broad band resonant reflector 152. The bandwidth of the resonant reflector is wider than that suggested by Wang et al. As indicated above, the bandwidth of a resonant reflector is primarily determined by the modulation of the refractive index and the fill factor of the grating. In accordance therewith, the present invention contemplates providing a broad band resonant reflector having a relatively wide bandwidth (FWHM>1 nm) in combination with a VCSEL or RCPD device.

Preferably, the bandwidth of the resonant reflector is sufficiently wide to increase the reliability of data communication between VCSEL and RCPD devices. FIG. 7 is a graph showing simulated reflectance characteristics of a resonant reflector having a resonance wavelength of 844.6 nm, and a FWHM 2.3 nm. These wider bandwidths are contemplated particularly for RCPD devices, and for VCSEL or resonant cavity LEDs that are intended to have a multi-mode emission.

A contact 156 is provided between the resonant reflector 152 and the active region 154. Thus, in this embodiment, the resonant reflector 152 need not be conductive, and need not be combined with a DBR mirror stack.

Despite the foregoing, it is recognized that the broad band resonant reflector 152 may be combined with a DBR, as shown in FIGS. 2 and 4 above. It is also contemplated that the broad band resonant reflector 152 may be made at least partially conductive to allow flexibility in the positioning of contact 156 within the structure. Finally, and as described below with reference to FIG. 8A–8B, the broad band resonant reflector may be used to form a RCPD device or a RCLED device.

Figure 8A:
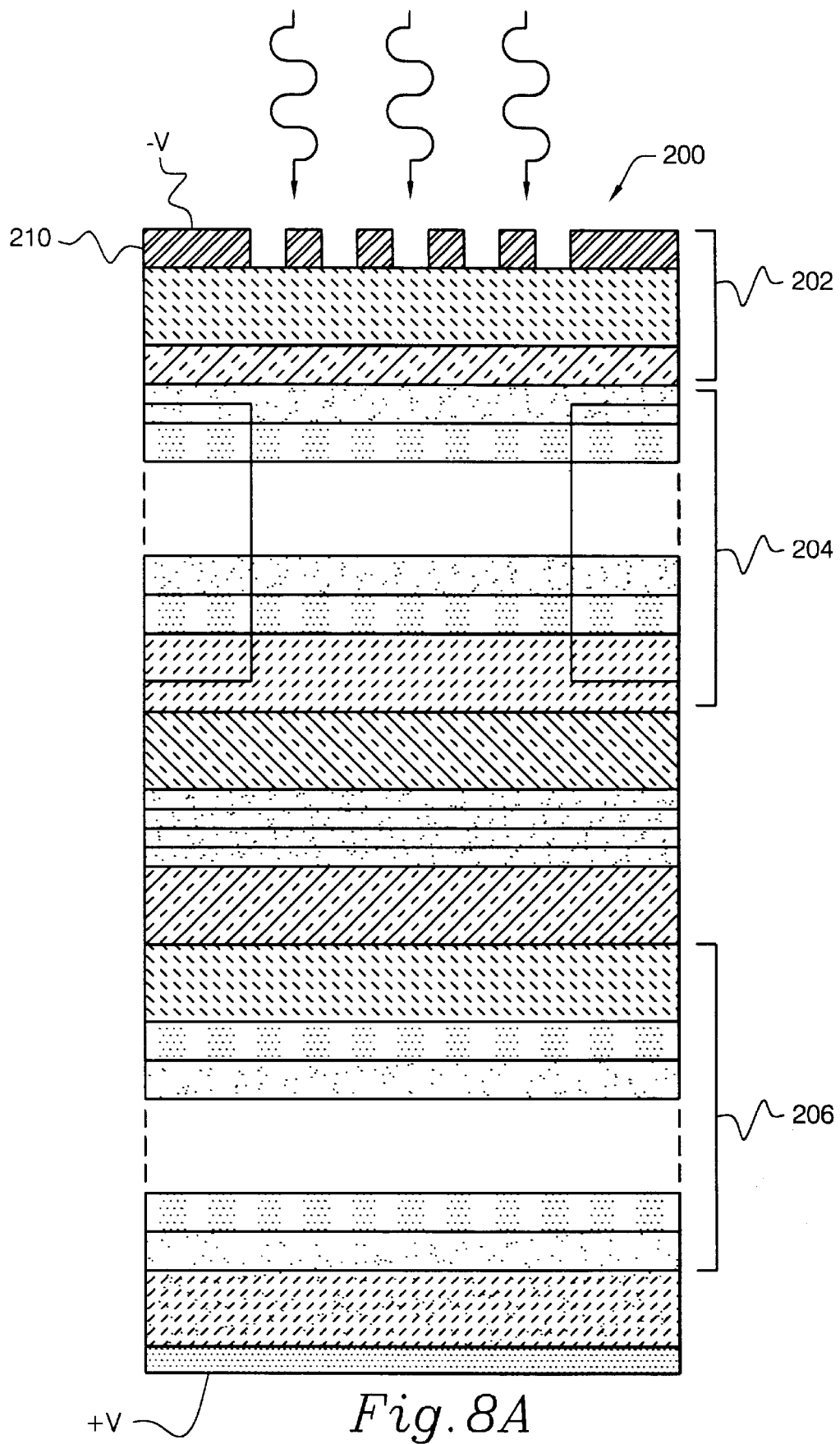
FIG. 8A is a schematic diagram of a resonant cavity photo-diode (RCPD) wherein the top mirror includes in combination a resonant reflector and a distributed Bragg reflector.

FIG. 8A is a schematic diagram of a resonant cavity photo-diode (RCPD) 200 wherein the top mirror includes in combination a resonant reflector 202 and a distributed Bragg reflector 204. In the embodiment shown, the resonant reflector 202 is made conductive, and the grating layer 210 also functions as the top contact. An advantage of this hybrid mirror approach is that the resonant reflector 202 may be made conductive, and any loss in reflectivity in the conductive resonant reflector 202 may be provided by the DBR mirror 204.

For RCPD applications, a broad band resonant reflector 202, having a wider bandwidth and lower reflectivity than that suggested by Wang et al., may replace either one or both of the conventional RCPD DBR mirrors (see FIG. 8B), or may be used in combination with one or more of the RCPD DBR mirrors as shown. As indicated above, the bandwidth of a resonant reflector is primarily determined by the modulation of the refractive index and the fill factor of the grating. In accordance therewith, the present invention contemplates providing a broad band resonant reflector having a relatively wide bandwidth (FWHM>1 nm) in combination with the RCPD device 200.

Preferably, the bandwidth of the resonant reflector is sufficiently wide to increase the reliability of data communication between a source and a RCPD device. FIG. 7 is a graph showing a resonant reflector having a resonance wavelength of 844.6 nm, and a FWHM=2.3 nm. It may be beneficial for the wavelength absorption of the RCPD device to be >1 nm to compensate for a number of factors including, for example, manufacturing tolerances of a transmitting VCSEL device and/or the receiving RCPD device, device alignment (e.g., angle of incidence), noise, heat and other factors.

Figure 8B:
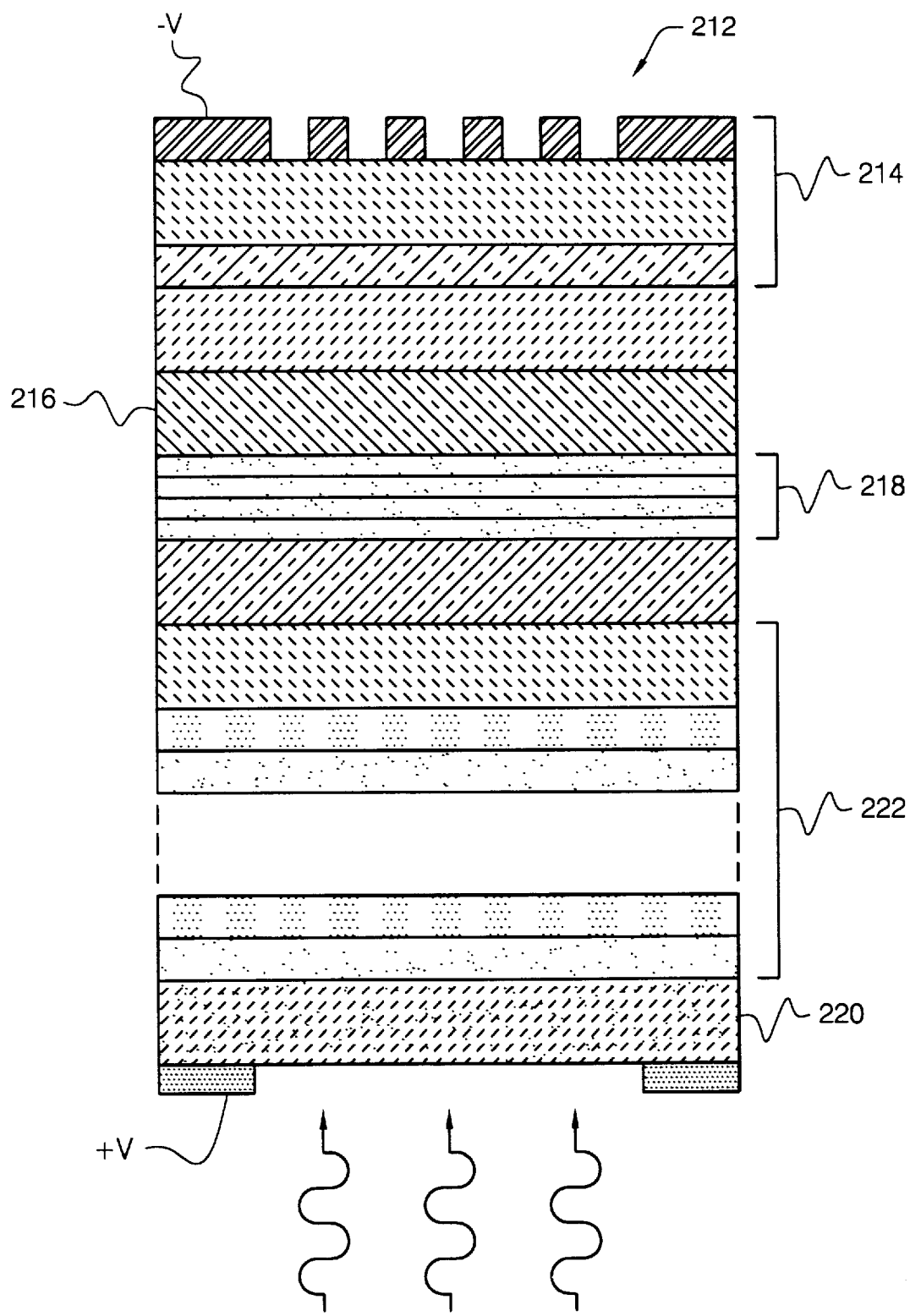
FIG. 8B is a schematic diagram of a resonant cavity photo-diode (RCPD) 212 with a resonant reflector 214 placed directly on the spacer layer 216.

FIG. 8B is a schematic diagram of a resonant cavity photo-diode (RCPD) 212 with a resonant reflector 214 placed directly on the spacer layer 216. In this embodiment, the conventional DBR top mirror is replaced with the resonant reflector 214. Preferably, the bandwidth of the resonant reflector 214 is sufficiently wide to increase the reliability of data communication between a source and a RCPD device.

FIG. 8A and FIG. 8B show a number of illustrative RCPD design features, some of which are known in the art. First, it is known that light may enter the RCPD device from either the top or the bottom of the RCPD device. FIG. 8A shows the light entering from the top of the RCPD device. FIG. 8B shows the light entering from the bottom of the device.

For the light to enter the bottom of the RCPD 212, and through the substrate as shown, it is contemplated that RCPD 212 may operate at about 980 nm. It is known that light having wavelengths of greater then 870 nm are generally not absorbed by a GaAs substrate, and may pass directly through the substrate 220 and into the bottom mirror. For the RCPD 212 to operate at 980 nm, it is contemplated that active region 218 may include an InGaAs quantum-well structure, rather than a conventional GaAs quantum-well structure that operates at about 850 nm.

Figure 9A:
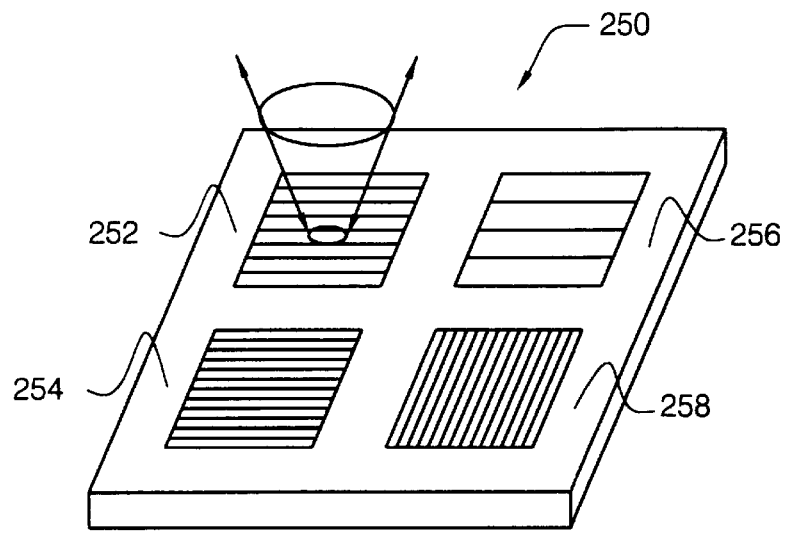
FIG. 9A is an illustrative schematic diagram of a number of opto-electronic devices for data/telecommunication, processing, switching, etc., including embodiments conducive for wavelength division multiplexing, polarization division multiplexing, and space division multiplexing.

FIG. 9A is an illustrative schematic diagram of a number of VCSEL, RCLED and/or RCPD devices that may be used for data/tele-communication, processing, switching, etc. The intrinsic small size, and attendant low-power and high speed of VCSEL and RCPD devices having an integrated resonant reflector makes such devices well suited for dense highly parallel Space Division Multiplexing (SDM), Wavelength Division Multiplexing (WDM) and/or Polarization Division Multiplexing (PDM) applications. Optical communication, processing, switching, etc. are contemplated using the devices of the present invention.

As indicated above, the resonant reflector includes a waveguide grating, which produces a polarized light output. Thus, the combination of a resonant reflector and a RCPD device may only detect a light signal with one desired polarization. Likewise, the waveguide grating may select a desired wavelength. The grating pitch and fill factor typically selects the desired wavelengths. Thus, the combination of a resonant reflector and a RCPD device may only detect a light signal at a desired wavelength.

Referring specifically to FIG. 9A, a number of monolithically formed devices are shown generally at 250. The waveguide grating is shown for each device as a number of parallel lines. A first device 252 has a waveguide grating with a first pitch extending in a first direction. The grating direction determines the polarization of the light that is resonantly reflected via the grating. For a VCSEL device, the output emission is thus inherently polarized. For a RCPD device, only light having a polarization that matches the waveguide grating is resonantly reflected by the RCPD cavity.

The pitch of the grating determines the wavelength of light that is resonant with the grating. For a VCSEL device, the output emission is inherently wavelength selective. For a RCPD device, only light that has the selected wavelength is sufficiently reflected in the RCPD cavity.

A second device 254 is shown having a waveguide grating with a second pitch also extending in the first direction. Thus, the second device 254 is polarized in the same direction as the first device 252. However, the narrower waveguide pitch of the second device will tend to select a shorter wavelength than the first device 252.

A third device 256 is shown having a waveguide grating with a third pitch also extending in the first direction. Thus, the third device 256 is polarized in the same direction as the first device 252 and the second device 254. The wider waveguide pitch of the third device 256 will tend to select a longer wavelength than that of the first device 252 and the second device 254.

Finally, a fourth device 258 is shown having a waveguide grating with a fourth pitch extending in a second direction. Thus, the fourth device 258 is polarized in an orthogonal direction as the first, second and third devices. The narrower waveguide pitch of the fourth device 258 will tend to select a shorter wavelength than the first, second and third devices.

As can readily be seen, changing the pitch and/or direction of the grating may allow designers to control lithographically both the operating wavelength and polarization of the corresponding devices. This may allow for hybrid SDM/WDM/PDM architectures having distributed wavelength and polarization nodes. Further, if the admission of light having any polarization is desired, the resonant reflector may be fabricated with two crossed gratings aligned orthogonally with each other (e.g. bi-gratings).

The decreased thickness required for the VCSEL and RCPD devices naturally leads to greater amenability to integration. Increased planarity and the utilization of standard semiconductor planar batch fabrication processes may improve producibility. The capability to readily control the wavelength, angular and bandwidth properties of the resonant reflector may allow flexibility in the construction of multi-element integrated circuits.

The wavelength selectivity capability of the resonant grating is also applicable to display applications. As the grating itself determines the wavelength of operation, and fabrication is done lithographically, laterally-displaced wavelength dependent emitters are contemplated. This may also serve as a quasi-tunable laser source. Wavelength tunable VCSELs and detectors may also find use in spectroscopic and sensing applications.

The improved performance coupled with the capability to control polarization lends itself to applications in polarization-sensitive optical read/write applications. Included are various forms of CD, DVD, and holographic storage applications. Laser printing heads should also benefit. The performance advantage, and use of thinner mirrors becomes even more paramount when extending VCSELs into the visible wavelengths where typical all-epitaxial DBRs become prohibitively thick and may require twice as many layers.

Figure 9B:
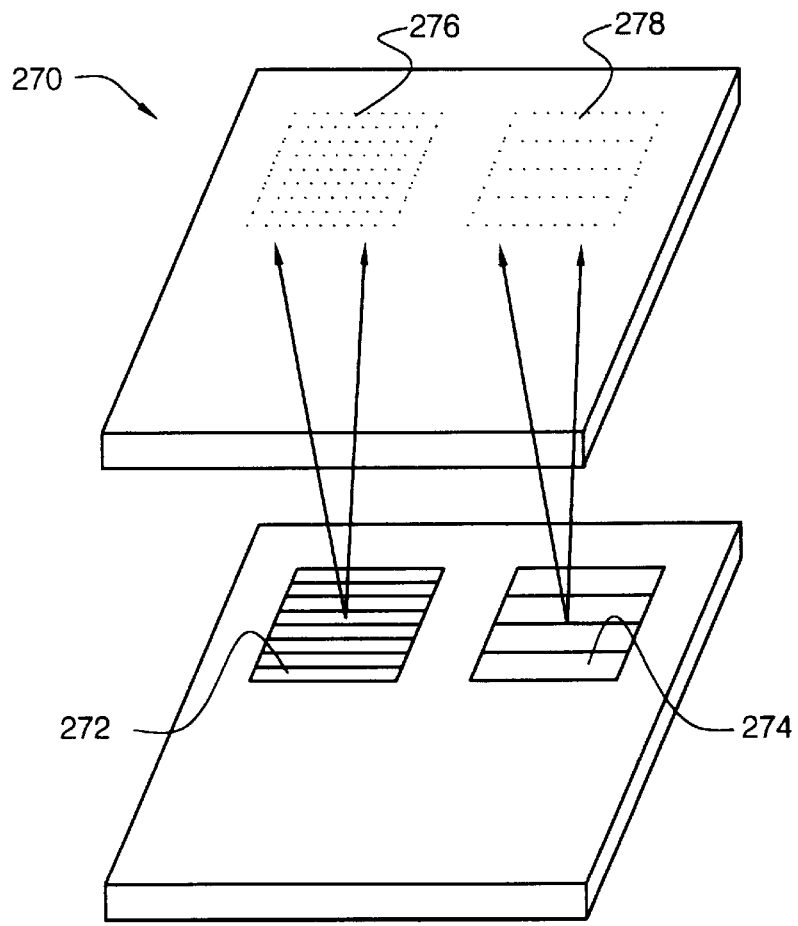
FIG. 9B is an illustrative schematic diagram of a number of VCSEL emitters and RCPD receivers.

FIG. 9B is an illustrative schematic diagram of a number of VCSEL emitters and RCPD receivers. The system is generally shown at 270. A first VCSEL device 272 provides a light output having a first polarization and a first wavelength. A second VCSEL device 274 provides a light output that is polarized in the same direction as the first VCSEL device 272, but with a different wavelength. In the illustrative embodiment, the first and second VCSEL devices 272 and 274, respectively, are provided on a single monolithic device.

Positioned on a second monolithic device is a first RCPD device 276 and a second RCPD device 278. The first RCPD device 276 has a waveguide grating that matches the waveguide grating of the first VCSEL device 272. Thus, the first RCPD device 276 may receive the light output of the first VCSEL device 272. Likewise, the second RCPD device 278 has a waveguide grating that matches the waveguide grating of the second VCSEL device 274. Thus, the second RCPD device 278 may receive the light output of the second VCSEL device 274. In the illustrative embodiment shown, the second monolithic device is laterally spaced from the first monolithic device.

Figure 9C:
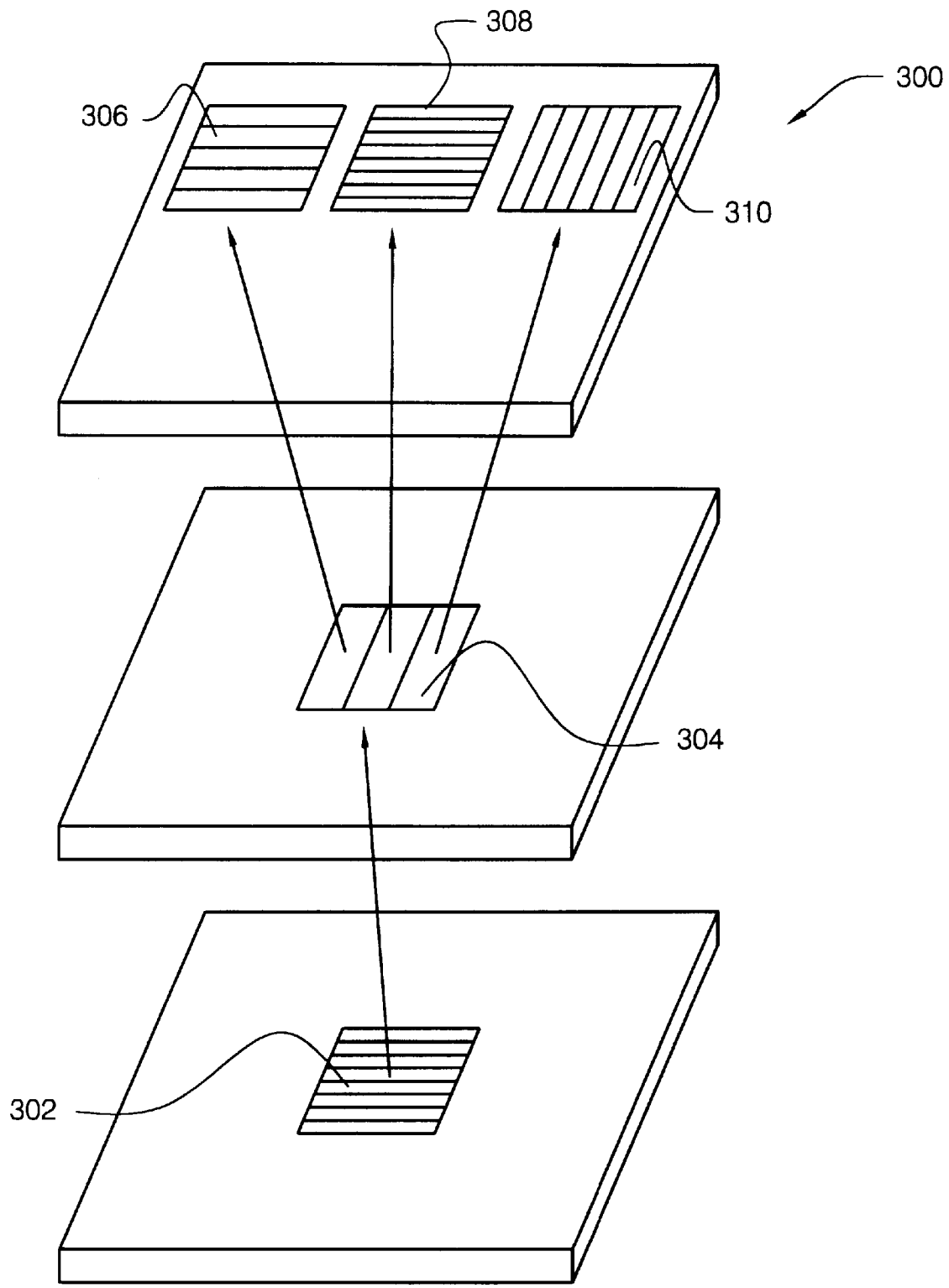
FIG. 9C is an illustrative schematic diagram of a VCSEL emitter, a number of RCPD receivers, and an optical fan-out element therebetween.

FIG. 9C is an illustrative schematic diagram of a VCSEL emitter, a number of RCPD receivers, and an optical fan-out element therebetween. In this system, a VCSEL device 302 provides a light output having a first polarization and a first wavelength. The light output is split by optical fan-out element 304 as shown. The optical fan-out element 304 provides the light output to RCPD devices 306, 308 and 310.

RCPD device 306 has a waveguide grating that is oriented in the same direction as VCSEL device 302, but has a grating pitch that is different from VCSEL device 302. Thus, RCPD device 306 is not activated by the light output of VCSEL device 302.

RCPD device 310 has a waveguide grating that is oriented orthogonally to VCSEL device 302, and has a grating pitch that is different from VCSEL device 302. Thus, RCPD device 310 is not activated by the light output of VCSEL device 302.

Finally, RCPD device 308 has a waveguide grating that matches the orientation and pitch of the VCSEL device 302. Thus, RCPD device 308 is activated by the light output of VCSEL device 302.

Figure 9D:
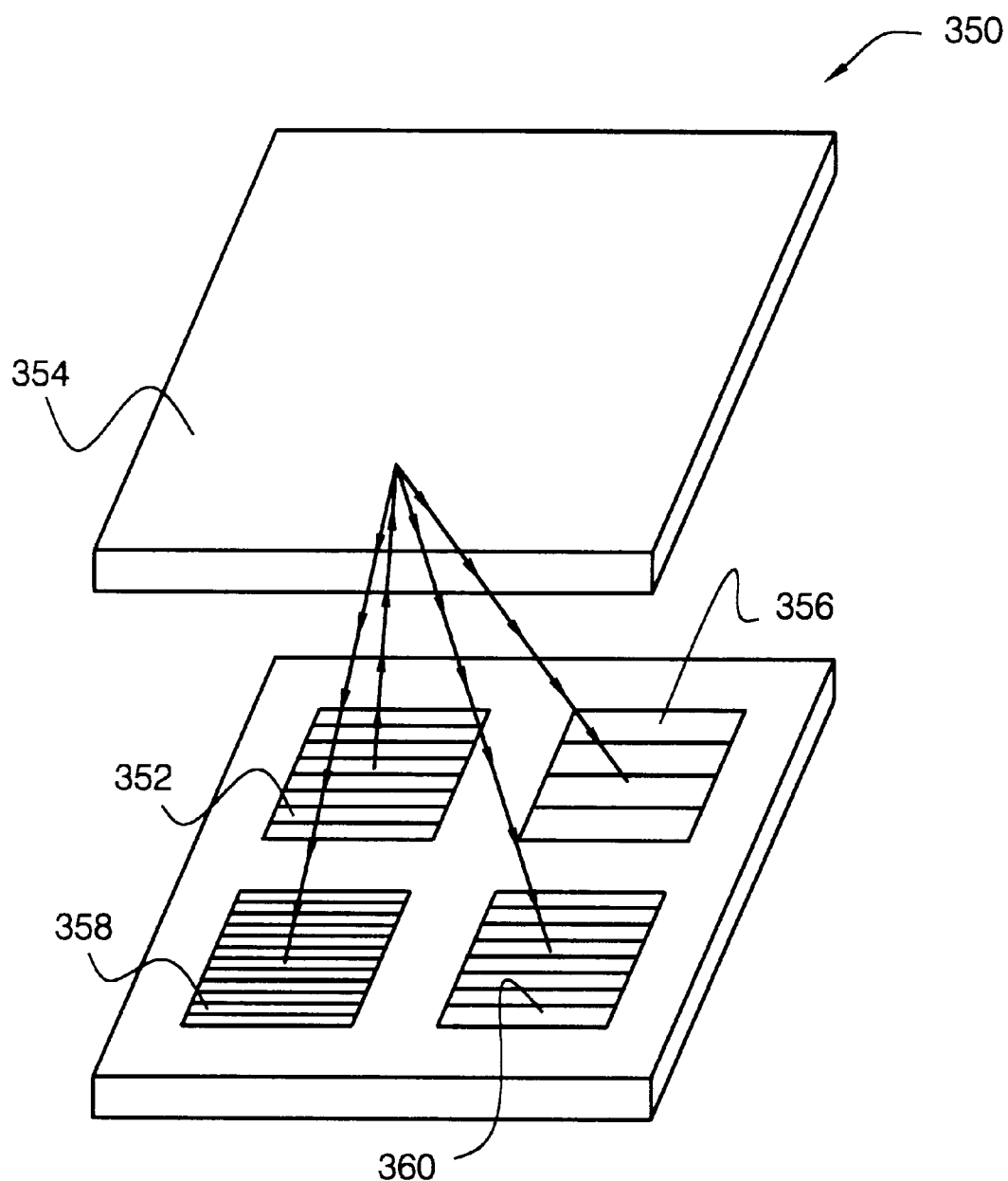
FIG. 9D is an illustrative schematic diagram of system for providing communication between a VCSEL emitter and a number of RCPD receivers located on a single monolithic device.

FIG. 9D is an illustrative schematic diagram of system for providing communication between a VCSEL emitter and a number of RCPD receivers located on a single monolithic device. The system is generally shown at 350. A VCSEL device 352 provides a light output having a first polarization and a first wavelength. The light output is reflected and distributed by optical element 354 as shown. RCPD devices 355, 358 and 360 are then exposed to the reflected light output.

RCPD device 356 has a waveguide grating that is oriented in the same direction as VCSEL device 352, but has a grating pitch that is different from VCSEL device 352. Thus, RCPD device 356 is not activated by the light output of VCSEL device 352. Likewise, RCPD device 358 has a waveguide grating that is oriented in the same direction as VCSEL device 352, but has a grating pitch that is different from VCSEL device 352. Thus, RCPD device 358 is not activated by the light output of VCSEL device 352.

RCPD device 360, however, has a waveguide grating that matches the orientation and pitch of the VCSEL device 352. Thus, RCPD device 360 is activated by the light output of VCSEL device 352.

These illustrative embodiments show that a waveguide grating provided in combination with VCSEL emitters and RCPD receivers readily support SDM, WDM and/or PDM applications. Optical communication, processing, switching, etc. are contemplated using the devices of the present invention.

Having thus described the preferred embodiments of the present invention, those of skill in the art will readily appreciate that the teachings found herein may be applied to yet other embodiments within the scope of the claims hereto attached.

What is claimed is:

1. A monolithic optoelectronic device having a top mirror and a bottom mirror, the improvement comprising:
    a non-metallic waveguide grating positioned adjacent at least one of the top mirror and the bottom mirror, said non-metallic waveguide grating having a waveguide and a grating; and
    an active region positioned between said first mirror and said second mirror.

2. An optoelectronic device according to claim 1 wherein said non-metallic waveguide grating comprises:
    a waveguide region; and
    a grating region.

3. An optoelectronic device according to claim 1 wherein said non-metallic waveguide grating comprises a waveguide region, wherein said waveguide region includes a number of layers including a grating layer.

4. An optoelectronic device according to claim 1 wherein said non-metallic waveguide grating is conductive.

5. An optoelectronic device according to claim 1 wherein at least part of said non-metallic waveguide grating is formed from a semiconductor material.

6. An optoelectronic device according to claim 5 wherein the semiconductor material of the non-metallic waveguide grating is doped to be conductive.

7. An aa-onic device according to claim 1 wherein said non-metallic waveguide grating comprises a number of layers, wherein each of the layers has a refractive index, the refractive index of at least one of the layers having a relatively large modulation such that said non-metallic waveguide grating has a relatively wide reflectance bandwidth.

8. An optoelectronic device according to claim 7 wherein the reflectance bandwidth is greater than 1 nanometer.

9. An optoelectronic device according to claim 7 wherein at least some of the layers are collectively anti-reflective.

10. An optoelectronic device according to claim 7 wherein at least some of the layers are collectively highly-reflective.

11. An optoelectronic device according to claim 1, wherein the optoelectronic device is a VCSEL device.

12. An optoelectronic device according to claim 1, wherein the optoelectronic device is a RCPD device.

13. An optoelectronic device according to claim 1, wherein the optoelectronic device is a RCLED.

14. An optoelectronic device comprising:
    a first mirror;
    a second mirror;
    an active region positioned between said first mirror and said second mirror; and
    non-metallic waveguide grating means positioned adjacent said first mirror, said non-metallic waveguide grating means having a waveguide and a grating for providing more reflectance at a predetermined range of wavelengths including a resonant wavelength.

15. An optoelectronic device according to claim 14 further comprising:
    first contact means electrically coupled to said active region through at least a portion of said first mirror; and
    second contact means electrically coupled to said active region through at least a portion of said second mirror.

16. An optoelectronic device according to claim 15 wherein said first contact means is positioned adjacent said non-metallic waveguide grating means.

17. An optoelectronic device according to claim 15 wherein said first mirror is positioned below said non-metallic waveguide grating means.

18. An optoelectronic device according to claim 14 wherein said at least a portion of said non-metallic waveguide grating means is formed from a semiconductor material.

19. An optoelectronic device according to claim 18 wherein the semiconductor material of the non-metallic waveguide grating is doped to be conductive.

20. An optoelectronic device according to claim 14 wherein said non-metallic waveguide grating means comprises a grating means and a waveguide means.

21. An optoelectronic device according to claim 20 wherein said grating means is positioned above said waveguide means.

22. An optoelectronic device according to claim 14, wherein the optoelectronic device is a VCSEL device.

23. An optoelectronic device according to claim 14, wherein the optoelectronic device is a RCPD device.

24. An optoelectronic device comprising:
    a first mirror having upper and lower opposing surfaces;
    a second mirror having upper and lower opposing surfaces;
    an active region positioned between the lower surface of said first mirror and the upper surface of said second mirror; and
    a non-metallic waveguide grating region having upper and lower opposing surfaces, the lower surface of said non-metallic waveguide grating region positioned adjacent the upper surface of said first mirror.

25. An optoelectronic device according to claim 24 further comprising:
    first contact means electrically coupled to said active region through at least a portion of said first mirror; and second contact means electrically coupled to said active region through at least a portion of said second mirror.

26. An optoelectronic device according to claim 25 wherein said non-metallic waveguide grating region comprises a waveguide region and a grating region.

27. An optoelectronic device according to claim 25, wherein the optoelectronic device is a VCSEL device.

28. An optoelectronic device according to claim 25, wherein the optoelectronic device is a RCPD device.

29. An optoelectronic device according to claim 24 wherein at least a portion of the non-metallic waveguide grating is conductive.

30. A method for forming an optoelectronic device, comprising the steps of:

forming a first mirror on a substrate;

forming an active region on the first mirror;

forming a second mirror on the active region; and forming a non-metallic waveguide grating on the second mirror, wherein the resonant reflector provides more reflectance at a predetermined range of wavelengths including a resonant wavelength.

31. A method according to claim 30 further comprising the step of:

providing a contact adjacent the non-metallic waveguide grating.

32. A method according to claim 30, further comprising the step of doping at least part of the non-metallic waveguide grating to be conductive.

33. An optical datapath, comprising:

a VCSEL device for providing a light output, said VCSEL device having a non-metallic waveguide grating integrated therewith, wherein said non-metallic waveguide grating has an orientation that polarizes the light output in a first direction; and a first RCPD device having a resonant reflector integrated therewith wherein said resonant reflector of said first RCPD device has the same orientation as said VCSEL device such that said first RCPD device detects the polarized light output of said VCSEL device.

34. An optical datapath according to claim 33 further comprising:

a second RCPD device having a resonant reflector integrated therewith wherein said resonant reflector of said second RCPD device has a different orientation than said VCSEL device such that said second RCPD device does not detect the polarized light output of said VCSEL device.

35. An optical datapath, comprising:

a VCSEL device having a non-metallic waveguide grating integrated therewith, said non-metallic waveguide grating having a waveguide grating that causes said VCSEL device to produce a light output that has a predetermined range of wavelengths; and a first RCPD device having a non-metallic waveguide grating integrated therewith wherein said non-metallic waveguide grating of said first RCPD device has a waveguide grating that corresponds to said waveguide grating of said VCSEL device such that said first RCPD device detects the predetermined range of wavelengths of light from said VCSEL device.

36. An optical datapath according to claim 35 further comprising:

a second RCPD device having a non-metallic waveguide grating integrated therewith wherein said non-metallic waveguide grating of said second RCPD device has a waveguide grating that does not correspond to said waveguide grating of said VCSEL device such that said second RCPD device does not detect the predetermined wavelength of light from said VCSEL device.

37. An optical datapath comprising:

a VCSEL device for providing a light output, said VCSEL device having a resonant reflector integrated therewith, wherein said resonant reflector has an orientation that polarizes the light output in a first direction; and a first RCPD device having a non-metallic waveguide grating integrated therewith wherein said non-metallic waveguide grating of said first RCPD device has the same orientation as said VCSEL device such that said first RCPD device detects the polarized light output of said VCSEL device.

* * * * *